(12) United States Patent
Lin et al.

(10) Patent No.: US 10,128,192 B2
(45) Date of Patent: Nov. 13, 2018

(54) FAN-OUT PACKAGE STRUCTURE

(71) Applicant: MEDIATEK INC., Hsin-Chu (TW)

(72) Inventors: Min-Chen Lin, Tainan (TW); Che-Ya Chou, Kaohsiung (TW); Nan-Cheng Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/498,542

(22) Filed: Apr. 27, 2017

(65) Prior Publication Data
US 2018/0025985 A1    Jan. 25, 2018

Related U.S. Application Data

(60) Provisional application No. 62/365,402, filed on Jul. 22, 2016.

(51) Int. Cl.
*H01L 25/16* (2006.01)
*H01L 23/12* (2006.01)
(Continued)

(52) U.S. Cl.
CPC ...... *H01L 23/5386* (2013.01); *H01L 23/3185* (2013.01); *H01L 23/5383* (2013.01); *H01L 23/5389* (2013.01); *H01L 23/552* (2013.01); *H01L 23/66* (2013.01); *H01L 24/16* (2013.01); *H01L 24/20* (2013.01); *H01L 2223/6677* (2013.01); *H01L 2224/04105* (2013.01); *H01L 2224/12105* (2013.01); *H01L 2224/16195* (2013.01); *H01L 2224/16227* (2013.01); *H01L 2224/24137* (2013.01);
(Continued)

(58) Field of Classification Search
CPC . H01L 2224/02379; H01L 2924/15172; H01L 2924/15173; H01L 2924/15174; H01L 2223/6677; H01L 23/5383; H01L 2225/1011; H01L 2225/1041; H01L 2225/4047; H01L 2225/107
See application file for complete search history.

(56) References Cited

U.S. PATENT DOCUMENTS 7,057,564 B2  6/2006  Tsai et al.
9,484,279 B2  11/2016  Pagaila et al.
(Continued)

FOREIGN PATENT DOCUMENTS

EP   2 930 742 A2   10/2015
TW   200629649 A    8/2006
(Continued)

*Primary Examiner* — Robert Bachner
*Assistant Examiner* — Molly Reida
(74) *Attorney, Agent, or Firm* — McClure, Qualey & Rodack, LLP

(57) ABSTRACT

A semiconductor package structure including a redistribution layer (RDL) structure having a first surface and a second surface opposite thereto is provided. The RDL structure includes an inter-metal dielectric (IMD) layer and a first conductive layer disposed at a first layer-level of the IMD layer. A molding compound covers the first surface of the RDL structure. A first semiconductor die is disposed over the second surface of the RDL structure and electrically coupled to the RDL structure. A plurality of bump structures is disposed over the second surface of the RDL structure and electrically coupled to the RDL structure.

15 Claims, 10 Drawing Sheets

(51) Int. Cl.
  *H01L 23/528* (2006.01)
  *H01L 23/31* (2006.01)
  *H01L 23/66* (2006.01)
  *H01L 23/538* (2006.01)
  *H01L 23/552* (2006.01)
  *H01L 23/00* (2006.01)

(52) U.S. Cl.
  CPC ............ *H01L 2224/24195* (2013.01); *H01L 2224/32225* (2013.01); *H01L 2224/73204* (2013.01); *H01L 2224/92125* (2013.01); *H01L 2924/1205* (2013.01); *H01L 2924/1206* (2013.01); *H01L 2924/1207* (2013.01); *H01L 2924/1421* (2013.01); *H01L 2924/1435* (2013.01); *H01L 2924/1438* (2013.01); *H01L 2924/15192* (2013.01); *H01L 2924/15321* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H01L 2924/3025* (2013.01); *H01L 2924/37001* (2013.01)

(56) References Cited

U.S. PATENT DOCUMENTS

| | | |
|---|---|---|
| 2006/0049995 A1 | 3/2006 | Imaoka et al. |
| 2007/0164418 A1 | 7/2007 | Brunnbauer |
| 2009/0155959 A1* | 6/2009 | Lin ............... H01L 21/4857 438/124 |
| 2013/0241059 A1 | 9/2013 | Boeck et al. |
| 2013/0264716 A1* | 10/2013 | Lin ............... H01L 21/6835 257/773 |
| 2013/0343022 A1 | 12/2013 | Hu et al. |
| 2014/0198013 A1 | 7/2014 | Saraswat et al. |
| 2016/0276325 A1 | 9/2016 | Nair et al. |
| 2017/0098589 A1 | 4/2017 | Liu et al. |

FOREIGN PATENT DOCUMENTS

| | | |
|---|---|---|
| TW | 201201345 A | 1/2012 |
| TW | 201434203 A | 9/2014 |
| TW | 201622079 A | 6/2016 |
| TW | 201714258 A | 4/2017 |

\* cited by examiner

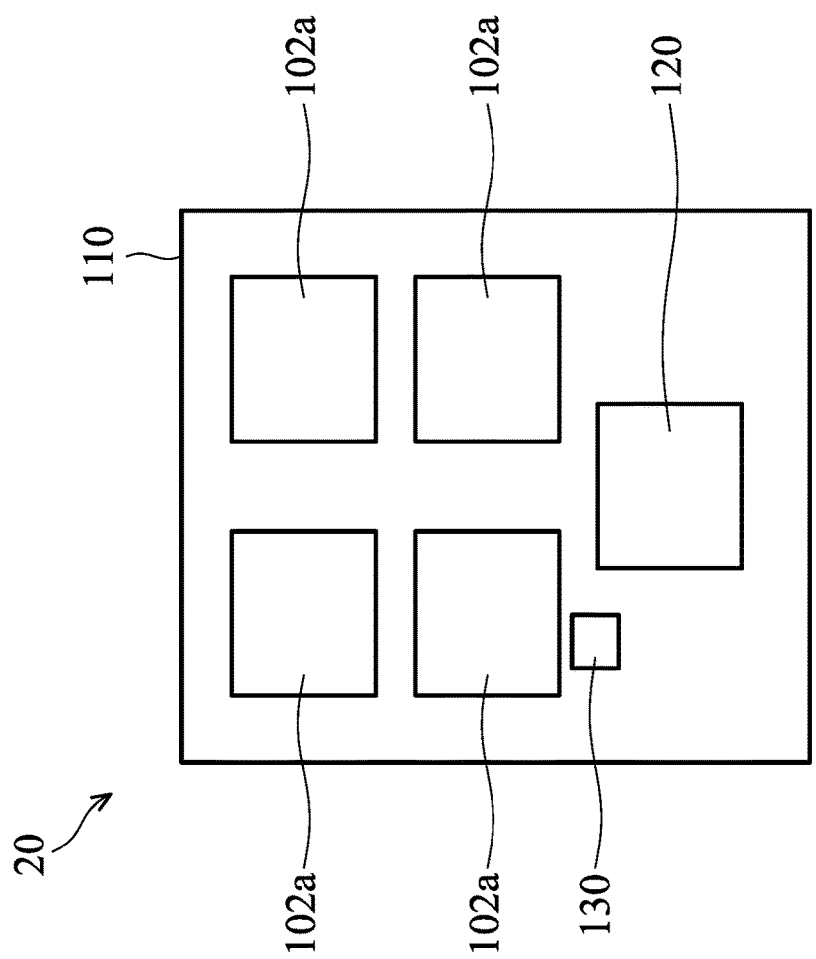

FAN-OUT PACKAGE STRUCTURE

CROSS REFERENCE TO RELATED APPLICATIONS

This application claims the benefit of U.S. Provisional Application No. 62/365,402 filed on Jul. 22, 2016, the entirety of which is incorporated by reference herein.

BACKGROUND OF THE INVENTION

Field of the Invention

The present invention relates to a semiconductor package structure, and in particular to a fan-out package structure.

Description of the Related Art

In order to ensure the continued miniaturization and multi-functionality of electronic products and communication devices, it is desired that semiconductor packages be small in size, support multi-pin connection, operate at high speeds, and have high functionality. Additionally, in a high frequency application, such as a radio frequency (RF) system-in-package (SiP) assembly, antennas are typically used for enabling wireless communication.

In a conventional SiP structure, a discrete antenna component is individually encapsulated or mounted on a printed circuit board (PCB) or package. Moreover, semiconductor dies, components, and passive devices are arranged side-by-side. However, it is required to provide additional area for the antenna component mounted thereon. Moreover, it is required to provide a large area for arrangement of these semiconductor dies, components, and passive devices.

As a result, it is difficult to reduce the footprint (i.e., plane size) of the SiP structure. Additionally, the reduction of the total height of the SiP structure is also difficult due to the configuration including the antenna component encapsulated or mounted on the package and the underlying semiconductor dies, components, and passive devices with a side-by-side arrangement.

Therefore, a novel semiconductor package structure is desirable.

BRIEF SUMMARY OF THE INVENTION

Semiconductor package structures are provided. An exemplary embodiment of a semiconductor package structure including a redistribution layer (RDL) structure having a first surface and a second surface opposite thereto is provided. The RDL structure includes an inter-metal dielectric (IMD) layer and a first conductive layer disposed at a first layer-level of the IMD layer. A molding compound covers the first surface of the RDL structure. A first semiconductor die is disposed over the second surface of the RDL structure and electrically coupled to the RDL structure. A plurality of bump structures is disposed over the second surface of the RDL structure and electrically coupled to the RDL structure.

Another exemplary embodiment of a semiconductor package structure including an RDL structure having a first surface and a second surface opposite thereto is provided. The RDL structure includes an IMD layer, a first conductive layer disposed at a first layer-level of the IMD layer, and a second conductive layer disposed at a second layer-level below the first layer-level of the IMD layer. A molding compound covers the first surface of the RDL structure. A first semiconductor die is disposed over the second surface of the RDL structure and electrically coupled to the RDL structure. A plurality of bump structures is disposed over the second surface of the RDL structure and electrically coupled to the RDL structure.

Yet another exemplary embodiment of a semiconductor package structure including an RDL structure having a first surface and a second surface opposite thereto is provided. The RDL structure includes an IMD layer, a first conductive layer disposed at a first layer-level of the IMD layer, a second conductive layer disposed at a second layer-level below the first layer-level of the IMD layer, and a third conductive layer disposed at a third layer-level below the second layer-level of the IMD layer. A molding compound covers the first surface of the RDL structure. A first semiconductor die is disposed over the second surface of the RDL structure and electrically coupled to the RDL structure. A plurality of bump structures is disposed over the second surface of the RDL structure and electrically coupled to the RDL structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2-1 is a plan view of an arrangement of an antenna pattern in the semiconductor package structure shown in FIG. 2.

FIG. 4-1 is a plan view of an arrangement of an antenna pattern and a ground shielding pattern in the semiconductor package structure shown in FIG. 4.

FIG. 5-1 is a plan view of an arrangement of an antenna pattern and a ground shielding pattern in the semiconductor package structure shown in FIG. 5.

FIG. 6-1 is a plan view of an arrangement of an antenna pattern and a ground shielding pattern in the semiconductor package structure shown in FIG. 6.

DETAILED DESCRIPTION OF THE INVENTION

Figure 1:
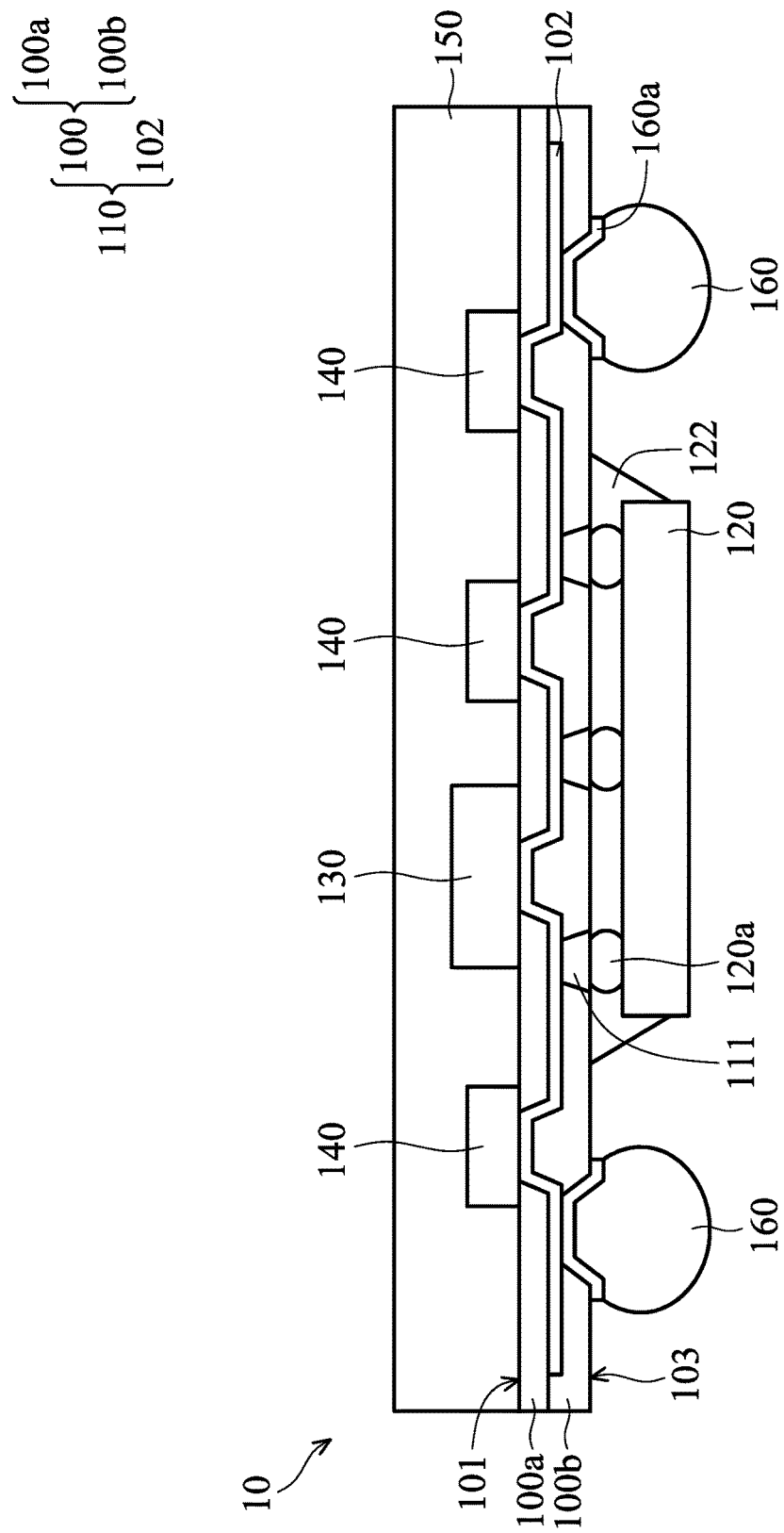
FIG. 1 is a cross-sectional view of an exemplary semiconductor package structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package structure 10 in accordance with some embodiments of the disclosure. In some embodiments, the semiconductor package structure 10 is a wafer-level semiconductor package structure, for example, a flip-chip semiconductor package structure.

Referring to FIG. 1, the semiconductor package structure 10 may be a wafer-level semiconductor package structure that may be mounted on a base (not shown). In some embodiments, the semiconductor package structure 10 may be a system-on-chip (SOC) package structure. Moreover, the base may include a printed circuit board (PCB) and may be formed of polypropylene (PP). In some embodiments, the base may include a package substrate. The semiconductor package structure 10 is mounted on the base by a bonding process. For example, the semiconductor package structure 10 includes bump structures 160 (such as conductive ball structures, conductive pillar structure, or conductive paste structures) that is mounted on and electrically coupled to the base by the bonding process.

In the embodiment, the semiconductor package structure 10 includes an RDL structure 110 and the bump structures 160 electrically coupled thereto. The RDL structure 110, which is also referred to as a fan-out structure, has a first surface 101 and a second surface 103 opposite thereto. In some embodiments, the RDL structure 110 includes one or more conductive layers disposed in an IMD layer 100. For example, a single first conductive layer 102 is disposed at a first layer-level of the IMD layer 100. In such cases, the IMD layer 100 may include first and second sub-dielectric layers 100a and 100b successively stacked from the first surface 101 of the RDL structure 110 toward the second surface 103 of the RDL structure 110, such that the first conductive layer 102 is positioned between the first and second sub-dielectric layers 100a and 100b. In some embodiments, the IMD layer 100 may be formed of organic materials, which include a polymer base material, non-organic materials, which include silicon nitride ($SiN_x$), silicon oxide ($SiO_x$), graphene, or the like. For example, the first and second sub-dielectric layers 100a and 100b are made of a polymer base material.

Moreover, the bump structures 160 are disposed over the second surface 103 of the RDL structure 110 and electrically coupled to the RDL structure 110. In some embodiments, pad portions of the first conductive layer 102 are exposed to openings of the second sub-dielectric layer 100b and connected to the corresponding bump structures 160 through the corresponding under bump metallization (UBM) layers 160a.

In the embodiment, the semiconductor package structure 10 further includes a first semiconductor die 120, such as an SOC die. The first semiconductor die 120 is disposed over the second surface 103 of the RDL structure 110 and the first conductive layer 102 is electrically coupled to the first semiconductor die 120. As shown in FIG. 1, the first semiconductor die 120 is fabricated by flip-chip technology.

Bump structures 120a of the first semiconductor die 120 are electrically connected to the circuitry (not shown) of the first semiconductor die 120. In some embodiments, the bump structures 120a of the first semiconductor die 120 are surrounded by an underfill layer 122 that is interposed between the second surface 103 of the RDL structure 110 and the first semiconductor die 120. Moreover, the bump structures 120a of the first semiconductor die 120 are in contact with corresponding conductive structures 111 (e.g., conductive bumps, posts or solder pastes), so that the first semiconductor die 120 is electrically coupled to the first conductive layers 102 through conductive structures 111. It should be noted that the number of SOC dies integrated in the semiconductor package structure 10 is not limited to that disclosed in the embodiment.

In the embodiment, the semiconductor package structure 10 further includes one or more second semiconductor dies 130 and one or more electronic components 140 disposed on the second surface 103 of the RDL structure 110. In order to simplify the diagram, only a second semiconductor die 130 and three electronic components 140 are depicted. Also, it should be noted that the number of semiconductor dies or electronic components integrated in the semiconductor package structure 10 is not limited to that disclosed in the embodiment.

In some embodiments, the second semiconductor die 130 and the electronic components 140 are arranged side-by-side and electrically coupled to the RDL structure 110 through the first conductive layer 102. In some embodiments, the second semiconductor die 130 is a radio frequency front-end component, an integrated passive device (IPD)), or a combination thereof. Alternatively, the second semiconductor die 130 may include a microcontroller (MCU), a microprocessor (MPU), a random access memory (RAM), a power management integrated circuit (PMIC), a flash memory, or a global positioning system (GPS) device, or any combination thereof. In some embodiments, the electronic component 140 is a passive device, such as a capacitor, an inductor, a resistor, or a combination thereof.

In the embodiment, the semiconductor package structure 10 further includes a molding compound 150 covering the first surface 101 of the RDL structure 110. In such a case, the second semiconductor die 130 and the electronic components 140 are disposed within the molding compound 150. In some embodiments, the molding compound 150 may be formed of an epoxy, a resin, a moldable polymer, or the like. The molding compound 150 may be applied while substantially liquid, and then may be cured through a chemical reaction, such as in an epoxy or resin. In some other embodiments, the molding compound 150 may be an ultraviolet (UV) or thermally cured polymer applied as a gel or malleable solid capable of being disposed around the second semiconductor die 130 and the electronic components 140, and then may be cured through a UV or thermal curing process. The molding compound 150 may be cured with a mold (not shown).

The bump structures 160 are separated from the molding compound 150 through the RDL structure 110. In other words, the bump structures 160 are free from contact with the molding compound 150.

Figure 2:
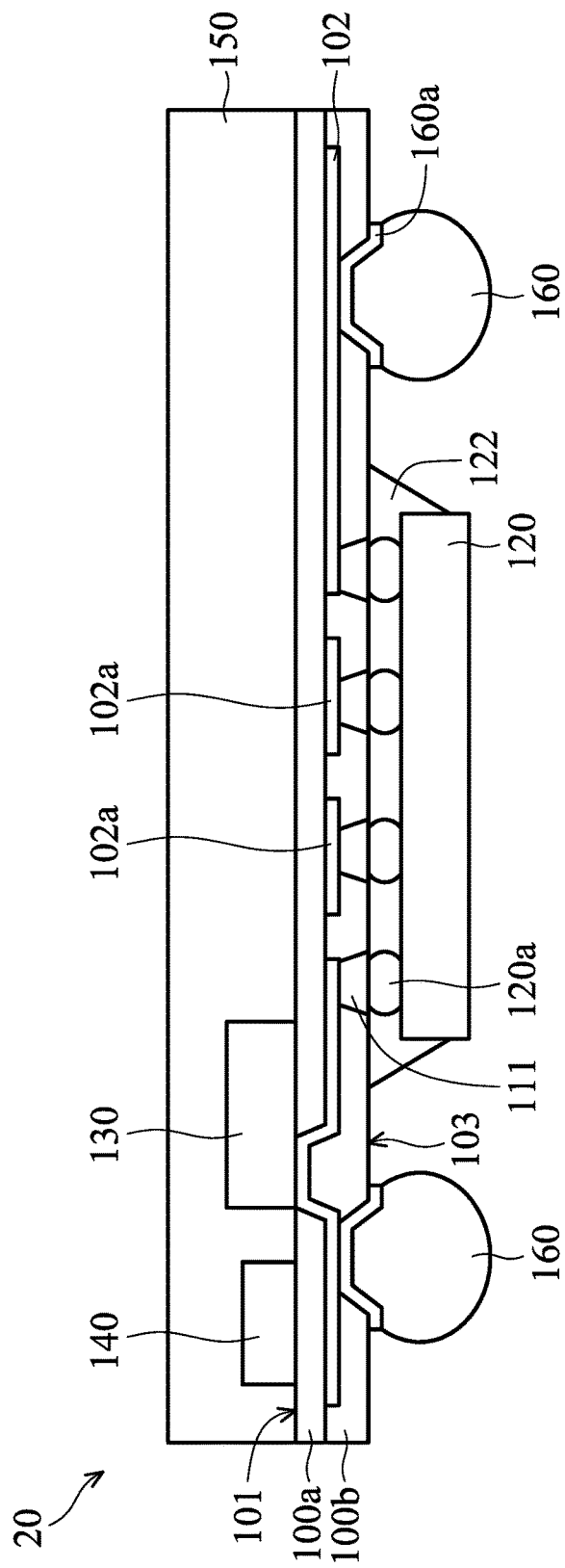
FIG. 2 is a cross-sectional view of an exemplary semiconductor package structure in accordance with some embodiments of the disclosure.

FIG. 2 is a cross-sectional view of an exemplary semiconductor package structure 20 in accordance with some embodiments of the disclosure and FIG. 2-1 is a plan view of an arrangement of an antenna pattern in the semiconductor package structure 20 shown in FIG. 2. Descriptions of elements of the embodiments hereinafter that are the same as or similar to those previously described with reference to FIG. 1 are omitted for brevity.

In the embodiment, the semiconductor package structure 20 is similar to the semiconductor package structure 10 shown in FIG. 1, except that the first conductive layer 102 has one or more antenna patterns 102a. The first conductive layer 102 with antenna patterns 102a enables wireless communication for the semiconductor package structure 20. Additionally, in order to simplify the diagram, only a second semiconductor die 130 and an electronic component 140 are depicted. Also, it should be noted that the number of semiconductor dies or electronic components integrated in the semiconductor package structure 20 is not limited to that disclosed in the embodiment.

As shown in FIG. 2-1, for example, the first conductive layer 102 has four antenna patterns 102a that are arranged in an array as seen from a top view. In such cases, the antenna patterns 102a of first conductive layer 102 are laterally spaced apart from the first semiconductor die 120, the second semiconductor die 130, and the electronic components 140 (not shown), as viewed from a top-view aspect. Moreover, each of the antenna patterns 102a of the first conductive layer 102 is rectangular, as viewed from a top-view aspect.

However, it should be understood that those of ordinary skill in the art know that various shapes can be used for the antenna patterns 102a of the first conductive layer 102. Also, it should be noted that the number of antenna patterns integrated in the semiconductor package structure 20 and the arrangement of the antenna patterns are not limited to those disclosed in the embodiment.

In the embodiment, since the antenna component is integrated in the RDL structure 110, the overall height of the semiconductor package structure 20 can be reduced.

In some embodiments, the first conductive layer 102 semiconductor package structure 20 may have a ground shielding pattern (not shown) instead of the antenna patterns. In such cases, the antenna patterns may be mounted on the semiconductor package structure 20. The ground shielding component may reduce the effect of electrical noise on the signals, and to reduce the electromagnetic radiation that can interfere with other devices.

Figure 3:
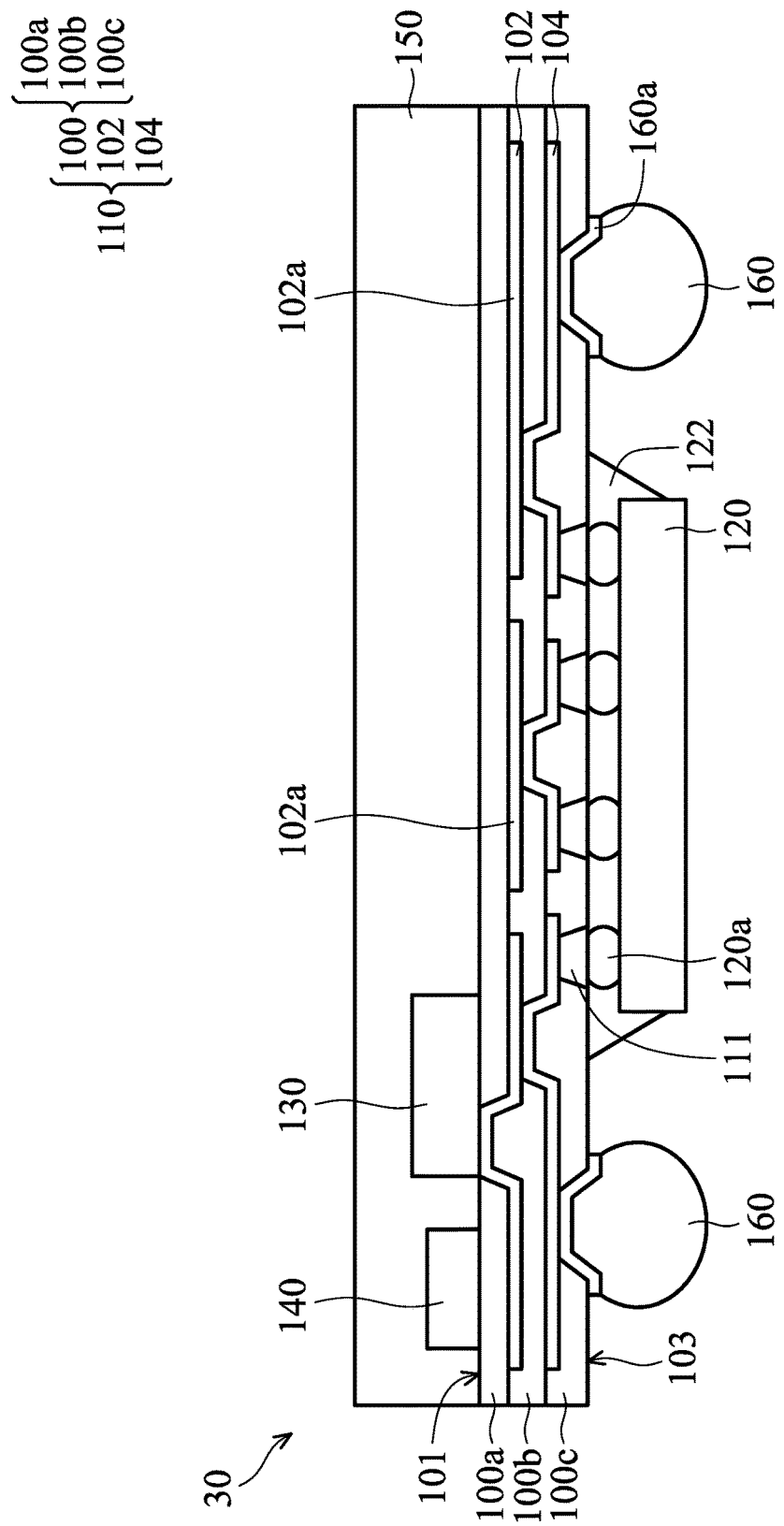
FIG. 3 is a cross-sectional view of an exemplary semiconductor package structure in accordance with some embodiments of the disclosure.

FIG. 3 is a cross-sectional view of an exemplary semiconductor package structure 30 in accordance with some embodiments of the disclosure. Descriptions of elements of the embodiments hereinafter that are the same as or similar to those previously described with reference to FIG. 1 or 2 are omitted for brevity.

In the embodiment, the semiconductor package structure 30 is similar to the semiconductor package structure 20 shown in FIG. 2, except the configuration of the RDL structure 110. In the embodiment, the RDL structure 110 includes two conductive layers disposed at different layer-levels of the IMD layer 100. For example, a first conductive layer 102 is disposed at a first layer-level of the IMD layer 100 and a second conductive layer 104 is disposed at a second layer-level below the first layer-level of the IMD layer 100. In such a case, the IMD layer 100 may include first, second, and third sub-dielectric layers 100a, 100b, and 100c successively stacked from the first surface 101 of the RDL structure 110 toward the second surface 103 of the RDL structure 110, such that the first conductive layer 102 is positioned between the first and second sub-dielectric layers 100a and 100b. Moreover, the second conductive layer 104 is positioned between the second and third sub-dielectric layers 100b and 100c.

In some embodiments, pad portions of the second conductive layer 104 are exposed to openings of the third sub-dielectric layer 100c and connected to the corresponding bump structures 160 through the corresponding UBM layers 160a.

In the embodiment, the antenna patterns 102a of the first conductive layer 102 may have a shape and an arrangement that are the same as or different than those shown in FIG. 2-1. It should be understood that those of ordinary skill in the art know that various shapes can be used for the antenna patterns 102a of the first conductive layer 102. Also, it should be noted that the number of antenna patterns integrated in the semiconductor package structure 30 and the arrangement of the antenna patterns are not limited to those disclosed in the embodiment.

In some embodiments, the first conductive layer 102 in the semiconductor package structure 30 may have a ground shielding pattern (not shown) instead of the antenna patterns. In such cases, the antenna patterns may be mounted on the semiconductor package structure 30.

Figure 4:
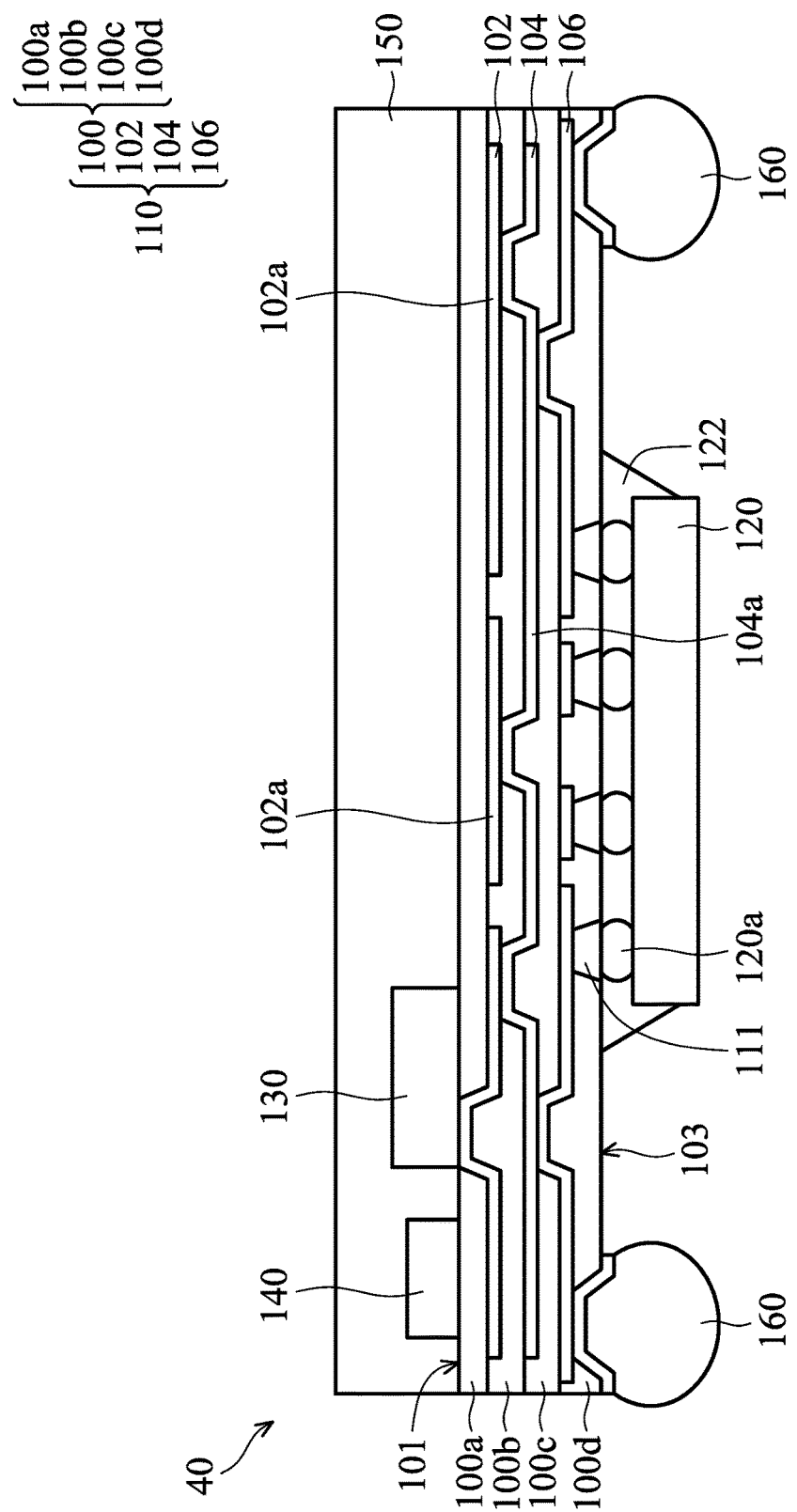
FIG. 4 is a cross-sectional view of an exemplary semiconductor package structure in accordance with some embodiments of the disclosure.
Figures 1, 4:
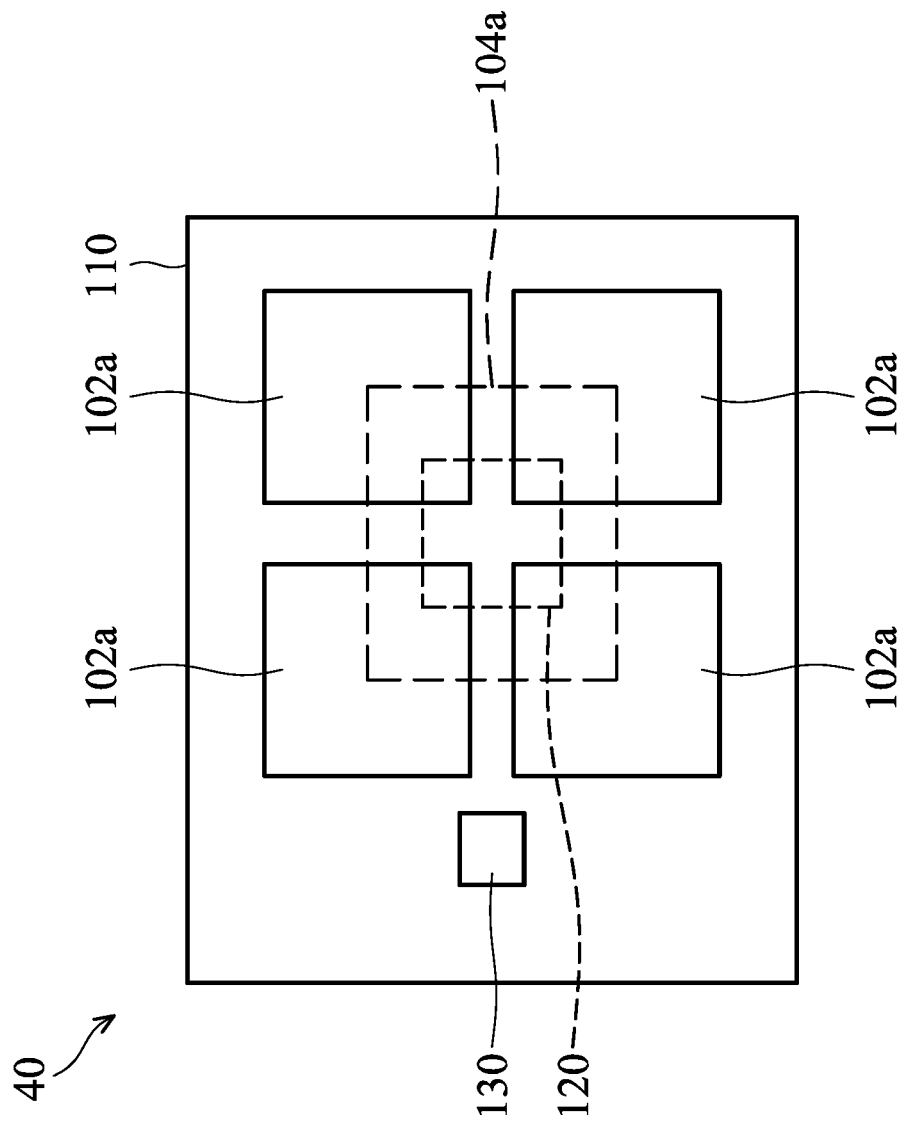

FIG. 4 is a cross-sectional view of an exemplary semiconductor package structure 40 in accordance with some embodiments of the disclosure and FIG. 4-1 is a plan view of an arrangement of an antenna pattern and a ground shielding pattern in the semiconductor package structure 40 shown in FIG. 4. Descriptions of elements of the embodiments hereinafter that are the same as or similar to those previously described with reference to FIG. 3 are omitted for brevity.

In the embodiment, the semiconductor package structure 40 is similar to the semiconductor package structure 30 shown in FIG. 3, except the configuration of the RDL structure 110. In the embodiment, the first conductive layer 102 has one or more antenna patterns 102a and the second conductive layer 104 has a ground shielding pattern 104a that is arranged underneath the antenna patterns 102a. The second conductive layer 104 with the ground shielding pattern 104a may reduce electrical noise between the antenna patterns 102a and the first semiconductor die 120, and reduce the electromagnetic radiation that can interfere with other devices.

Moreover, in the embodiment, the RDL structure 110 includes three conductive layers disposed at different layer-levels of the IMD layer 100. For example, a first conductive layer 102 is disposed at a first layer-level of the IMD layer 100, a second conductive layer 104 is disposed at a second layer-level below the first layer-level of the IMD layer 100, and a third conductive layer 106 disposed at a third layer-level below the second layer-level of the IMD layer 100. In such a case, the IMD layer 100 may include first, second, third, and fourth sub-dielectric layers 100a, 100b, 100c, and 100d successively stacked from the first surface 101 of the RDL structure 110 toward the second surface 103 of the RDL structure 110, such that the first conductive layer 102 is positioned between the first and second sub-dielectric layers 100a and 100b. Moreover, the second conductive layer 104 is positioned between the second and third sub-dielectric layers 100b and 100c. Additionally, the third conductive layer 106 is positioned between the third and fourth sub-dielectric layers 100c and 100d.

In some embodiments, pad portions of the third conductive layer 106 are exposed to openings of the fourth sub-dielectric layer 100d and connected to the corresponding bump structures 160 through the corresponding UBM layers 160a.

As shown in FIG. 4-1, for example, the first conductive layer 102 has four antenna patterns 102a that are arranged in an array as seen from a top view. In such a case, the surface of the first semiconductor die 120 is entirely covered by the ground shielding pattern 104a, as viewed from a top-view aspect. Moreover, the antenna patterns 102a of first conductive layer 102 are laterally spaced apart from the second semiconductor die 130 and the electronic components 140 (not shown), as viewed from a top-view aspect. Each of the antenna patterns 102a of the first conductive layer 102 is rectangular, as viewed from a top-view aspect.

However, it should be understood that those of ordinary skill in the art know that various shapes can be used for the antenna patterns 102a of the first conductive layer 102. Also, it should be noted that the number of antenna patterns integrated in the semiconductor package structure 40 and the arrangement of the antenna patterns are not limited to those disclosed in the embodiment.

In the embodiment, since the antenna component is integrated in the RDL structure 110, the overall height of the semiconductor package structure 40 can be reduced. Moreover, since the ground shielding component is integrated in the RDL structure 110, the electrical noise between the antenna patterns 102a and the first semiconductor die 120 can be prevented by the ground shielding component. As a result, the first semiconductor die 120 can be arranged underneath the antenna component, as shown in FIG. 4-1, thereby reducing the footprint (i.e., plane size) of the semiconductor package structure 40.

Figure 5:
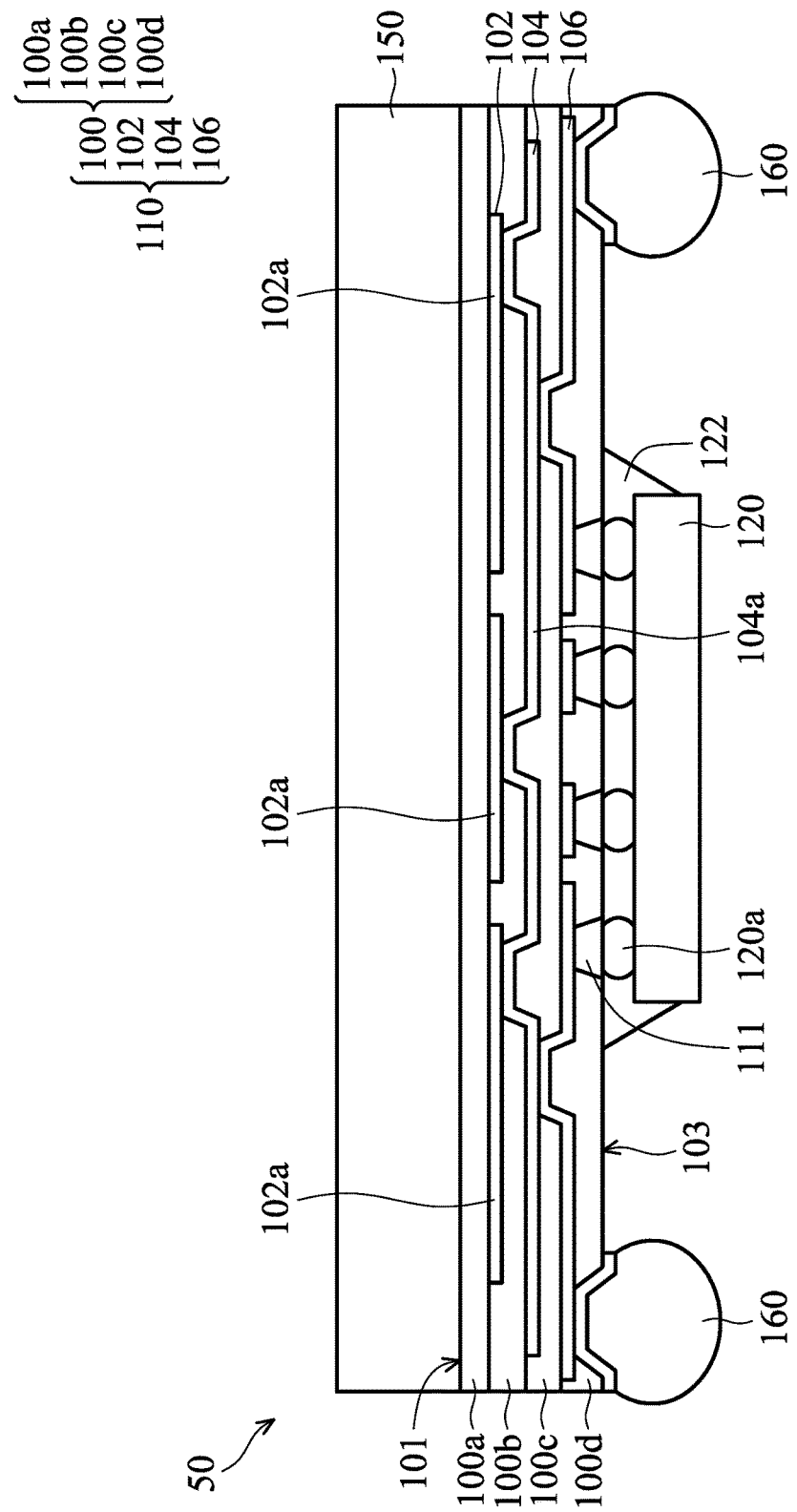
FIG. 5 is a cross-sectional view of an exemplary semiconductor package structure in accordance with some embodiments of the disclosure.
Figures 1, 5:
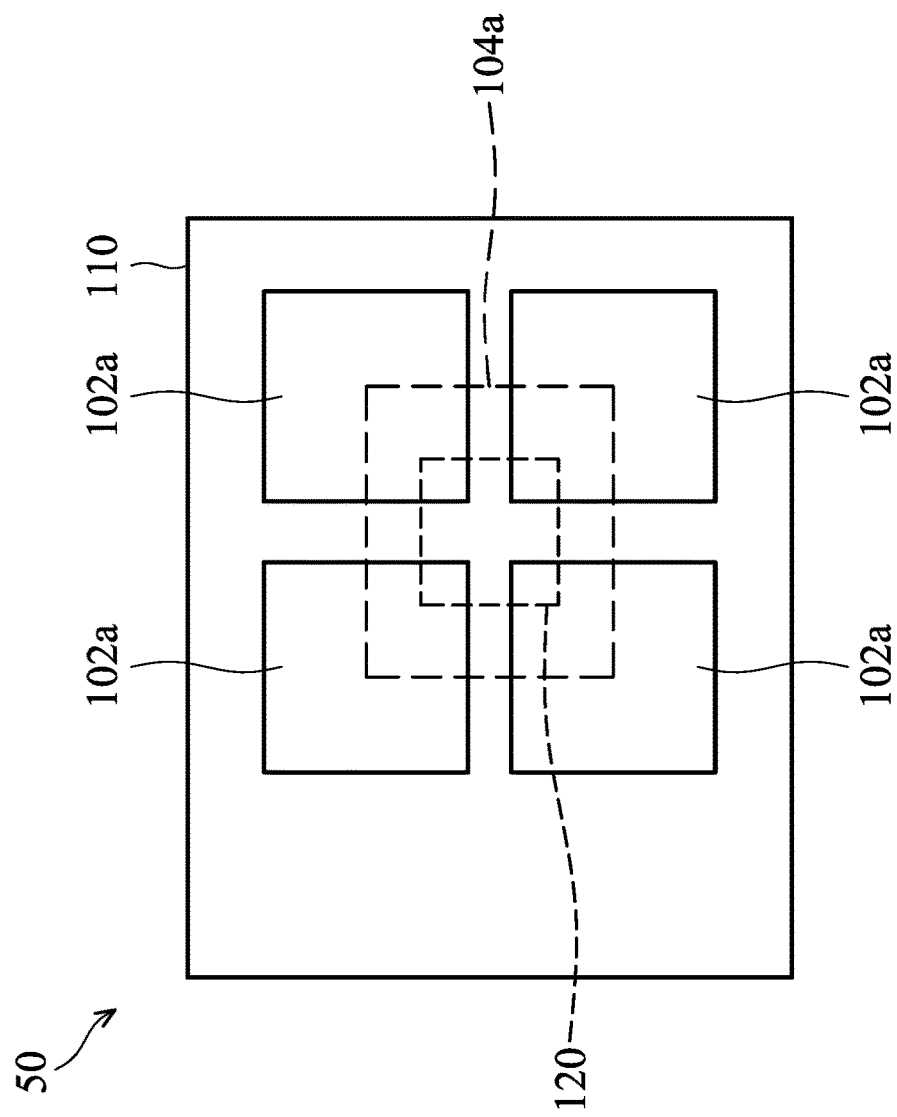

FIG. 5 is a cross-sectional view of an exemplary semiconductor package structure 50 in accordance with some embodiments of the disclosure and FIG. 5-1 is a plan view of an arrangement of an antenna pattern and a ground shielding pattern in the semiconductor package structure 50 shown in FIG. 5. Descriptions of elements of the embodiments hereinafter that are the same as or similar to those previously described with reference to FIG. 4 or 4-1 are omitted for brevity.

In the embodiment, the semiconductor package structure 50 is similar to the semiconductor package structure 40 shown in FIG. 4. Unlike the semiconductor package structure 40, the second semiconductor die 130 and electronic components 140 (as shown in FIG. 4) are not disposed in the semiconductor package structure 50.

As shown in FIG. 5-1, in the semiconductor package structure 50, the antenna patterns 102a of the first conductive layer 102 may have a shape and an arrangement that are the same as those shown in FIG. 4-1. Moreover, the arrangement of the ground shielding pattern 104a and the first semiconductor die 120 is the same as that shown in FIG. 4-1. However, it should be understood that those of ordinary skill in the art know that various shapes can be used for the antenna patterns 102a of the first conductive layer 102. Also, it should be noted that the number of antenna patterns integrated in the semiconductor package structure 50 and the arrangement of the antenna patterns are not limited to those disclosed in the embodiment.

Figure 6:
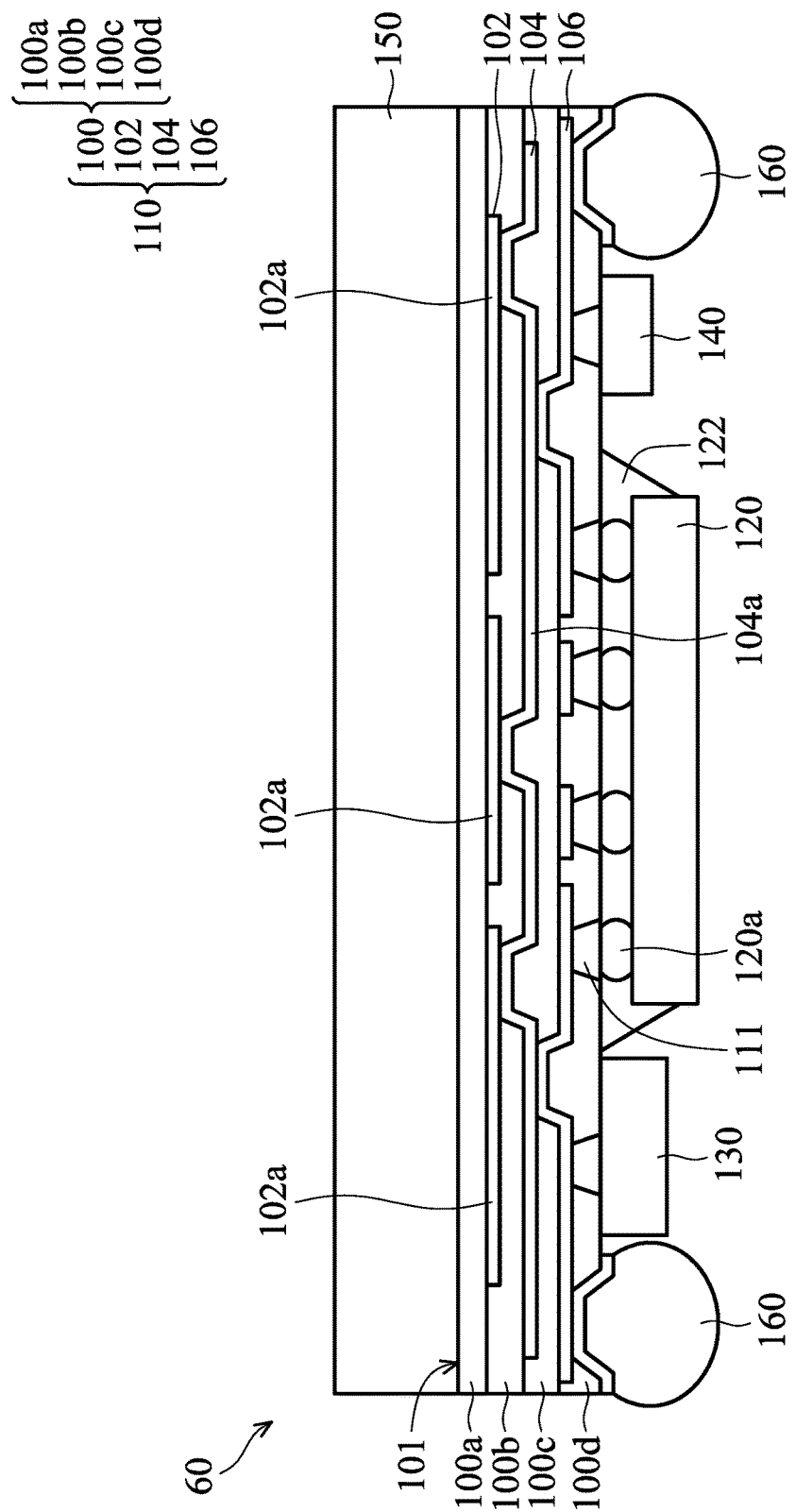
FIG. 6 is a cross-sectional view of an exemplary semiconductor package structure in accordance with some embodiments of the disclosure.
Figures 1, 6:
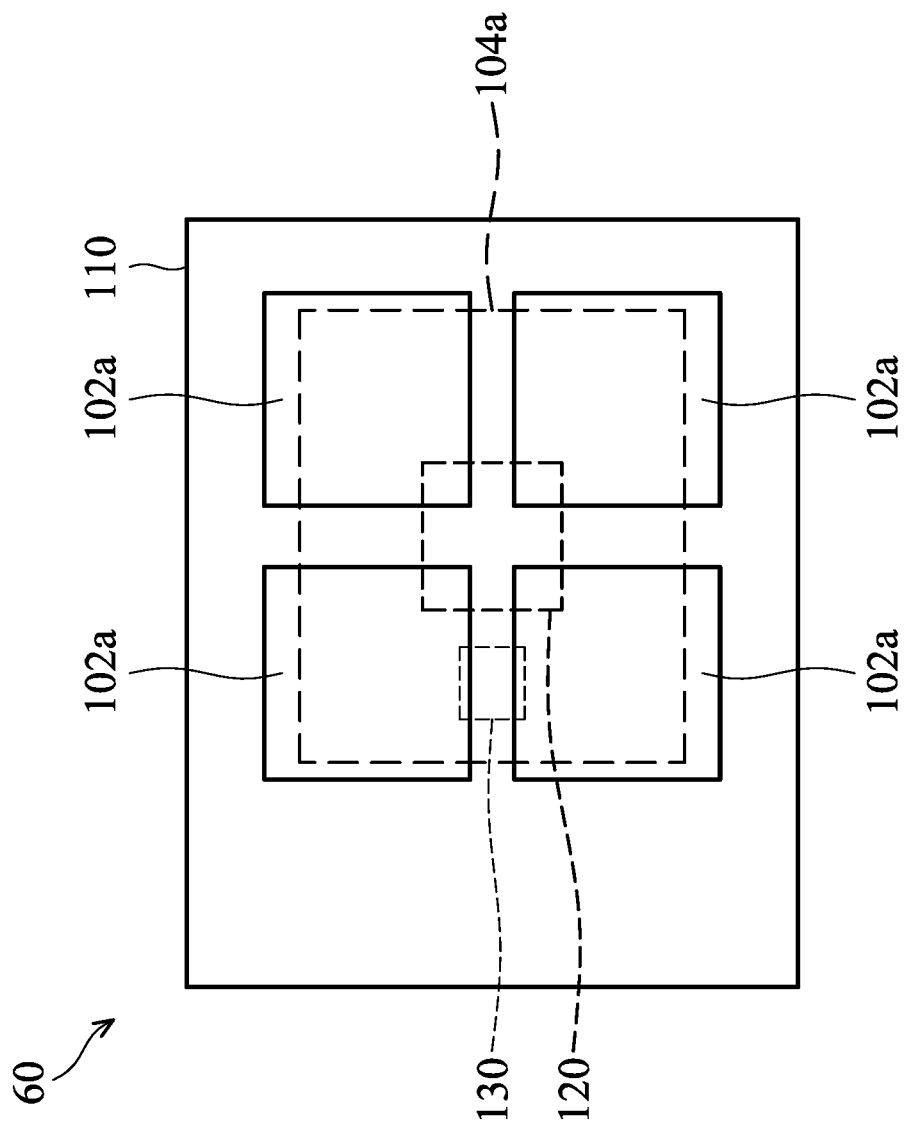

FIG. 6 is a cross-sectional view of an exemplary semiconductor package structure 60 in accordance with some embodiments of the disclosure and FIG. 6-1 is a plan view of an arrangement of an antenna pattern and a ground shielding pattern in the semiconductor package structure 60 shown in FIG. 6. Descriptions of elements of the embodiments hereinafter that are the same as or similar to those previously described with reference to FIG. 4 or 4-1 are omitted for brevity.

In the embodiment, the semiconductor package structure 60 is similar to the semiconductor package structure 40 shown in FIG. 4. In the semiconductor package structure 60, unlike the semiconductor package structure 40, the second semiconductor die 130 and the electronic components 140 are disposed over the second surface 103 of the RDL structure 110, such that the first semiconductor die 120, the second semiconductor die 130 and the electronic components 140 are arranged side-by-side.

As shown in FIG. 6-1, in the semiconductor package structure 60, the antenna patterns 102a of the first conductive layer 102 may have a shape and an arrangement that are the same as those shown in FIG. 4-1. However, it should be understood that those of ordinary skill in the art know that various shapes can be used for the antenna patterns 102a of the first conductive layer 102. Also, it should be noted that the number of antenna patterns integrated in the semiconductor package structure 60 and the arrangement of the antenna patterns are not limited to those disclosed in the embodiment.

In the embodiment, unlike the semiconductor package structure 40, the surfaces of the first semiconductor die 120, the second semiconductor die 130, and the electronic components 140 (not shown) are entirely covered by the ground shielding pattern 104a, as viewed from a top-view aspect.

In the embodiment, since the antenna component is integrated in the RDL structure 110, the overall height of the semiconductor package structure 60 can be reduced. Moreover, since the ground shielding component is integrated in the RDL structure 110, the electrical noise between the antenna patterns 102a and the first semiconductor die 120 can be prevented by the ground shielding component. As a result, the first semiconductor die 120, the second semiconductor die 130, and the electronic components 140 (not shown) can be arranged underneath the antenna component, as shown in FIG. 6-1. As a result, the footprint (i.e., plane size) of the semiconductor package structure 60 can be further reduced compared to the semiconductor package structure 40.

According to the foregoing embodiments, the semiconductor package structure is designed to fabricate an antenna component and a ground shielding component integrated into the semiconductor package(s). These components can be formed by an RDL process. Accordingly, there is no need to perform an additional process for forming the antenna component and the ground shielding component. As a result, reliability, yield, and throughput of the semiconductor package structure are increased and the manufacturing cost of the semiconductor package structure is reduced. Additionally, the integrated antenna and ground shielding components can provide design flexibility for the system integration of the semiconductor package structure and effectively reduce the package size.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a redistribution layer (RDL) structure having a first surface and a second surface opposite thereto, wherein the RDL structure comprises:
   an inter-metal dielectric (IMD) layer;
   a first conductive layer disposed at a first layer-level of the IMD layer; and a second conductive layer disposed at a second layer-level below the first layer-level of the IMD layer, wherein the second conductive layer has a ground shielding pattern;

a molding compound covering the first surface of the RDL structure;

a first semiconductor die disposed over the second surface of the RDL structure and electrically coupled to the RDL structure, wherein a surface of the first semiconductor die is entirely covered by the ground shielding pattern; and a plurality of bump structures disposed over the second surface of the RDL structure and electrically coupled to the RDL structure.

2. The semiconductor package structure as claimed in claim 1, further comprising a second semiconductor die and an electronic component disposed within the molding compound, arranged side-by-side, and electrically coupled to the RDL structure.

3. The semiconductor package structure as claimed in claim 2, wherein the electronic component comprises a capacitor, an inductor, a resistor, or a combination thereof.

4. The semiconductor package structure as claimed in claim 2, wherein the second semiconductor die comprises a radio frequency front-end component, an integrated passive device, or a combination thereof.

5. The semiconductor package structure as claimed in claim 1, wherein the first conductive layer has a ground shielding pattern.

6. The semiconductor package structure as claimed in claim 1, wherein the first conductive layer has an antenna pattern that is laterally spaced apart from the first semiconductor die, the second semiconductor die, and the electronic component, as viewed from a top-view aspect.

7. A semiconductor package structure, comprising:

a redistribution layer (RDL) structure having a first surface and a second surface opposite thereto, wherein the RDL structure comprises:

an inter-metal dielectric (IMD) layer;

a first conductive layer disposed at a first layer-level of the IMD layer, wherein the first conductive layer has an antenna pattern;

a second conductive layer disposed at a second layer-level below the first layer-level of the IMD layer, wherein the second conductive layer has a ground shielding pattern; and a third conductive layer disposed at a third layer-level below the second layer-level of the IMD layer;

a molding compound covering the first surface of the RDL structure;

a first semiconductor die disposed over the second surface of the RDL structure and electrically coupled to the RDL structure, wherein a surface of the first semiconductor die is entirely covered by the ground shielding pattern; and a plurality of bump structures disposed over the second surface of the RDL structure and electrically coupled to the RDL structure.

8. The semiconductor package structure as claimed in claim 7, further comprising a second semiconductor die and an electronic component disposed within the molding compound, arranged side-by-side, and electrically coupled to the RDL structure.

9. The semiconductor package structure as claimed in claim 8, wherein the electronic component comprises a capacitor, an inductor, a resistor, or a combination thereof.

10. The semiconductor package structure as claimed in claim 8, wherein the second semiconductor die comprises a radio frequency front-end component, an integrated passive device, or a combination thereof.

11. The semiconductor package structure as claimed in claim 8, wherein the ground shielding pattern is disposed underneath the antenna pattern and the antenna pattern is laterally spaced apart from the second semiconductor die, as viewed from a top-view aspect.

12. The semiconductor package structure as claimed in claim 7, further comprising a second semiconductor die and an electronic component disposed over the second surface of the RDL structure, arranged side-by-side, and electrically coupled to the RDL structure.

13. The semiconductor package structure as claimed in claim 12, wherein the electronic component comprises a capacitor, an inductor, a resistor, or a combination thereof.

14. The semiconductor package structure as claimed in claim 12, wherein the second semiconductor die comprises a radio frequency front-end component, an integrated passive device, or a combination thereof.

15. The semiconductor package structure as claimed in claim 12, wherein the ground shielding pattern is disposed underneath the antenna pattern and entirely covers surfaces of the first semiconductor die and the second semiconductor die, as viewed from a top-view aspect.

* * * * *